United States Patent

Hiscocks

[15] 3,688,018

[45] Aug. 29, 1972

[54] ELECTRICAL DEVICE SUBSTRATES

[72] Inventor: Stephen Edward Ralph Hiscocks, Malvern, England

[73] Assignee: Minister of Technology in Her Britannic Majesty's Government of the United Kingdom of Great Britain and Northern Ireland, 3, Millbank, London, S.W. 1, England

[22] Filed: July 27, 1970

[21] Appl. No.: 58,578

[30] Foreign Application Priority Data

July 30, 1969 Great Britain..........38,241/69

[52] U.S. Cl...................174/68.5, 29/626, 75/134 R, 148/1.5, 148/1.6, 317/101 A, 317/101 CC, 317/234 J

[51] Int. Cl..............................................H05k 1/18

[58] Field of Search......174/68.5; 307/101 A, 101 C, 307/101 CC, 234 H, 234 G, 235 H; 75/134 R, 134 H; 148/1.5, 1.6; 29/191.4, 626, 625; 264/68; 161/169, 213

[56] References Cited

UNITED STATES PATENTS

| | | | |
|---|---|---|---|
| 3,267,405 | 8/1966 | Weiss et al. | 75/134 R X |
| 3,323,198 | 6/1967 | Shortes | 174/68.5 X |
| 3,325,881 | 6/1967 | Engelking | 174/68.5 X |
| 3,434,827 | 3/1969 | Lemkey | 75/134 H |
| 3,501,342 | 3/1970 | Haberecht et al. | 317/101 A X |
| 3,541,222 | 11/1970 | Parks et al. | 174/68.5 |

*Primary Examiner*—Darrell L. Clay
*Attorney*—Hall, Pollock & Vande Sande

[57] ABSTRACT

An electrical substrate including a plurality of rods of a conducting material embedded in a matrix of an insulating material, the rods extending in the same general direction as each other between two major faces of the substrate.

16 Claims, 3 Drawing Figures

Stephen Edward Ralph Hiscocks
Inventor by Hall, Pollock & Vande Sande
Attorneys

Stephen Edward Ralph Hiscocks
Inventor by Hall, Pollock & Vande Sande
Attorneys.

ELECTRICAL DEVICE SUBSTRATES

BACKGROUND OF THE INVENTION

The present invention relates to electrical device substrates.

Many electrical devices are, for necessity or convenience, mounted on substrates. For example, integrated circuits or single elements such as transistors may be epitaxially grown on substrates and thin film circuits may be deposited on substrates. Other devices may be fabricated independently of s substrate and subsequently mounted on a substrate for reasons of frigidity or strength or for hermetic sealing.

It is a feature of such devices that electrical connections can only be made to them at the edge or on the face away from the substrate.

SUMMARY OF THE INVENTION

According to the present invention there is provided an electrical substrate including a plurality or rods of a conductive first material embedded in a matrix of an insulator second material, the rods extending in the same general direction as each other between two major faces of the substrate.

According to the invention in another aspect there is provided an electrical device mounted on a substrate which includes a plurality of rods of a conductive first material embedded in a matrix of an insulator second material, the rods extending in the same general direction as each other between two major faces of the substrate, and in the electrical device is mounted on one of the the two major faces of the substrate and electrical connections are made to the device by way of the other major face of the substrate.

BRIEF DESCRIPTION OF THE DRAWINGS

An embodiment of the invention will be described by way of example with reference to the accompanying drawings, in which.

DESCRIPTION OF THE PREFERRED EMBODIMENTS

In a two-component system in which the component may be either elements or compounds, a eutectic mixture will typically solidify at a eutectic temperature to form a solid which consists of an intimate mixture of crystals of the two components. The particular morphology adopted by this mixture of the two phases depends upon a number of factors which include the nature of the components, the composition of the eutectic mixture and the conditions of crystallization.

If the components are both metal-like and the eutectic composition is in the region of equal proportions between the components, then the phases are commonly present in the form of lamellae whose thickness varies with the rate of crystallization but is typically of the order of microns. If, however, the eutectic composition differs greatly from equal proportions between the constituents, then the material frequently crystallizes in the form of rods of the minor phase embedded in a matrix of the major phase. The rods are aligned or nearly so in the direction of growth.

The embodiment described uses a morphology in which a plurality of rods of a first material are embedded parallel to one another in a matrix of a second material. The first material is an electrical conductor and the second material is an electrical insulator.

Possible materials include:

gallium titanide, $GaTi_2$, in a matrix of gallium arsenide molybdenum arsenide, MoAs, in a matrix of gallium arsenide chromium arsenide, CrAs, in a matrix of gallium arsenide niobium silicide, $NbSi_2$, in a matrix of silicon tantalum silicide, $TaSi_2$, in a matrix of silicon molybdenum silicide, $MoSi_2$, in a matrix of silicon.

The matrix material should be as good an insulator as possible in all cases. The gallium arsenide is preferably semi-insulating.

The materials may be grown by most processes which involve growth from the melt at a planar interface, such as horizontal or vertical zone melting, pulling in a Czochralski crystal puller, vertical Stockbarger or horizontal Bridgman techniques, Verneuil techniques or float zone preparation. The techniques may, where appropriate, be used in conjunction with liquid encapsulation, as described in United Kingdom Pat. No. 1,113,069 and U.S. Pat. No. 3,401,023, issued Sept. 10, 1968, to John Brian Mullin.

Figure 1:
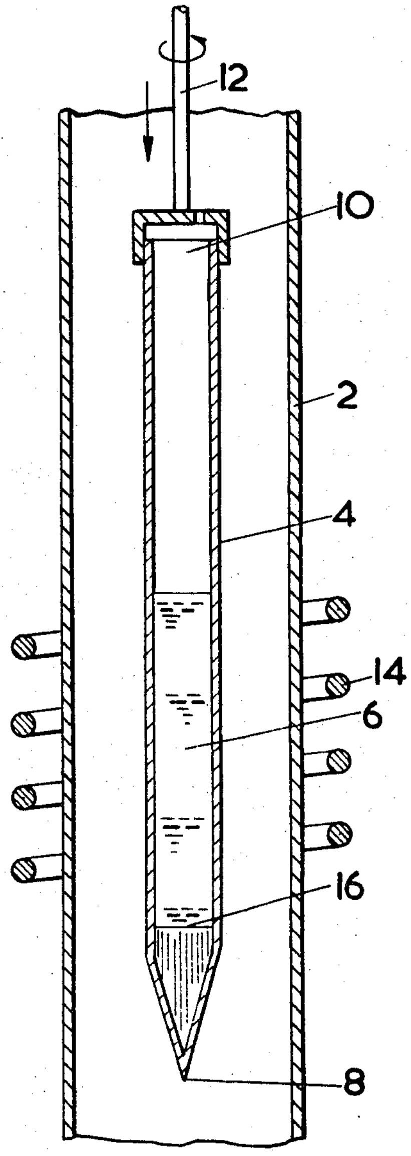
FIG. 1 is a cross-sectional diagram of a Stockbarger vertical crystal growing apparatus.

FIG. 1 is a cross-sectional diagram of a Stockbarger vertical crystal growing apparatus. A silica furnace tube 2 is arranged vertically. Inside the tube 2 a silica crucible 4 holds a charge of mixture 6 in eutectic proportions or thereabouts. The lower end 8 of the crucible 4 is pointed and the upper end 10 of the crucible 4 is open and supported on a rod 12. An induction heater 14 surrounds part of the tube 2.

The action of the apparatus is as follows. Initially the end 8 of the crucible 4 is located within the induction heater 14 and the heat output of the induction heater 14 is arranged to be sufficient for that part of the charge 6 in the end 8 to be melted. When that part of the charge is melted and thoroughly mixed the crucible 4 is rotated and slowly fed downwards. This causes more of the charge 6 to enter the region of influence of the induction heater 14 and so to melt. At the same time that part of the charge 6 at the end 8 of the crucible 4 will cool and solidify. If the interface 16 between the solid material and the melt is kept planar, then the rods are more likely to be aligned parallel to one another.

In other words, conventional silicon techniques are used throughout.

It is to be noted that the size and spacing of the rods varies with the growth rate. Empirically, if $s$ is the average separation of the rods and $v$ is the velocity of growth, then $s^2v$ is approximately constant. Once $s$ is fixed, the average diameter of the rods follows from the eutectic composition.

Results that have been obtained are set out in the following Examples.

EXAMPLE 1

A charge of the correct proportions of niobium and silicon to give the eutectic composition of niobium silicide, $NbSi_2$in silicon, Si (92 weight percent of silicon) was prepared and put into a crucible in the apparatus described above with reference to FIG. 1. The purity of the starting materials was Nb 99.9 percent, Si 99.99 percent. The charge was heated until melted. The crucible was then rotated at 7 r.p.m. and fed downwards at 1.5 centimeters per hour.

The resulting material showed most of the microstructure to be rod-like in character interspersed with lamellae. The rods were several microns in diameter with a uniform size and distribution over the areas examined. The structure was well aligned and continuous.

EXAMPLE 2

A charge of the correct proportions of niobium and silicon to give the eutectic composition of niobium silicide, $NbSi_2$, in silicon, Si (92 weight percent of silicon) was prepared and put into a crucible in the apparatus described above with reference to FIG. 1. The purity of the starting materials was Nb 99.9 percent, Si 99.9999 percent. The charge was heated until melted. The crucible was then rotated at 7 r.p.m. and fed downwards at 1 centimeter per hour.

The resulting material showed most of the microstructure to be rod-like in character interspersed with lamellae. The rods were several microns in diameter with a uniform size and distribution over the areas examined. The structure was well aligned and continuous.

EXAMPLE 3

A charge of the correct proportions of tantalum and silicon to give the eutectic composition of tantalum silicide, $TaSi_2$, in silicon, Si (94 weight percent of silicon) was prepared and put into a crucible in the apparatus described above with reference to FIG. 1. The purity of the starting materials was Ta 99.7 percent, Si 99.9999 percent. The charge was heated until melted. The crucible was then rotated at 7 r.p.m. and fed downwards at 1 centimeter per hour.

The resulting material showed the microstructure to be rod-like. The rods were generally 1 to 3 microns in diameter, but the microstructure was inferior to that obtained in Examples 1 and 2 in uniformity of diameter and in uniformity of distribution of the rods.

EXAMPLE 4

A charge of the correct proportions of molybdenum and silicon to give the eutectic composition of molybdenum silicide, $MoSi_2$, in silicon, Si (95 weight percent of silicon) was prepared and put in a crucible in the apparatus described above with reference to FIG. 1. The purity of the starting materials was Mo 99.95 percent, Si 99.99 percent. The charge was heated until melted. The crucible was then rotated at 7 r.p.m. and fed downwards at 1 centimeter per hour.

The resulting material showed the microstructure to be rod-like interspersed with lamellae. The diameter of the rods was fairly uniform (3 to 4 microns) but the distribution was slightly irregular.

Figure 2:
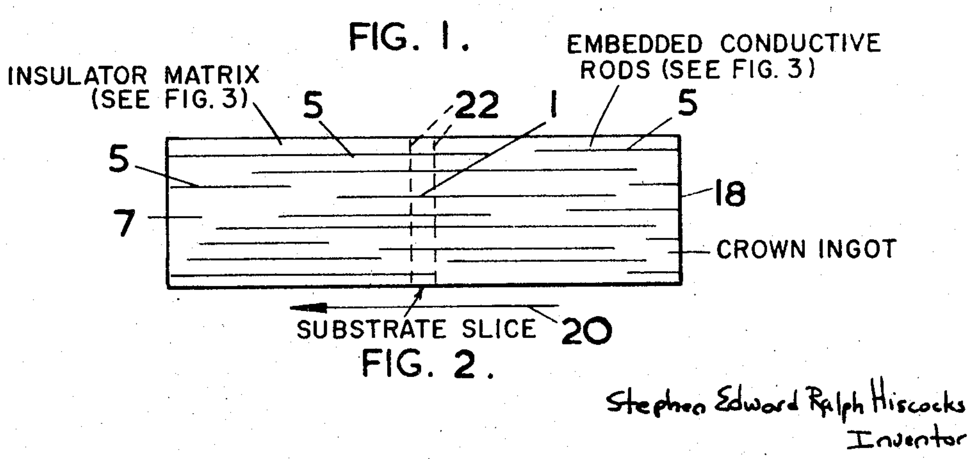
FIG. 2 is a cross-sectional diagram of an ingot of eutectic material grown in the apparatus described with reference to FIG. 1.

FIG. 2 is a cross-sectional diagram of an ingot of eutectic material grown in the apparatus described with reference to FIG. 1.

The ingot 18 consists of a plurality of conducting rods 5 embedded in an insulating matrix 7. The rods 5 are aligned in the direction 20 of growth. In order to prepare a substrate a slice is taken from the ingot 18 by sawing it in planes 22 perpendicular to the direction 20 of growth. The resulting slice 1 is polished by conventional techniques.

Figure 3:
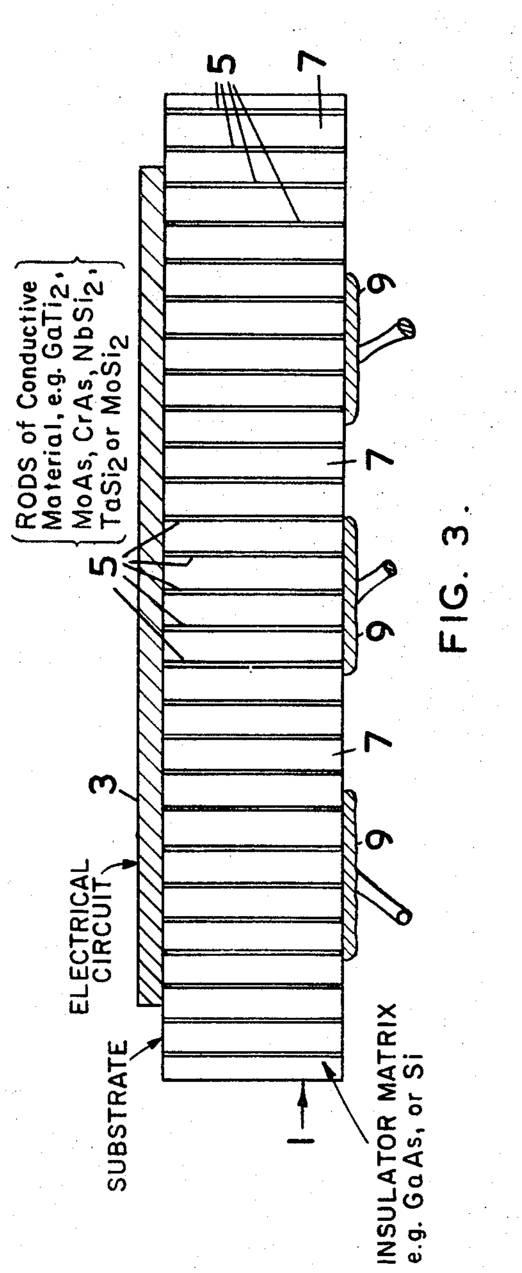
FIG. 3 is a cross-sectional diagram of an electrical device mounted on a substrate.

FIG. 3 is a cross-sectional diagram of an electrical device mounted on the substrate 1. In this example the device is a circuit 3 which is mounted or deposited (epitaxially or otherwise) on the face of the substrate 1 in such a way as to ensure good electrical contact between terminals of the circuit 3 to which contact is to be made and the rods 5 adjacent to those parts. It is advantageous for the relationship between the density of the rods and the terminal areas to be such that each terminal area is connected to a plurality of rods in order to ensure good contact.

External contacts 9 may be made to the underside of the substrate 1 by evaporation or other conventional microelectronic techniques. If the rods 5 are sufficiently good conductors and the matrix 7 a sufficiently good insulator then the arrangement will allow low impedance connections and isolation between adjacent contact areas in the circuit 3.

I claim:

1. An electrical substrate having two major faces at least one of which is suitable for the epitaxial deposition of electrical components, said substrate including a plurality of rods of a conductive material embedded in an insulator matrix of gallium arsenide, said rods being microscopic in cross section and extending in the same general direction as each other between the two major faces of the substrate.

2. An electrical substrate as claimed in claim 1, including an electrical device mounted on one of the two major faces of the substrate, said electrical device having terminals electrical connections being made to the terminals of said device via said conductive rods by way of the other major face of the substrate.

3. An electrical substrate as claimed in claim 1 in which said conductive material is gallium titanide, $GaTi_2$.

4. An electrical substrate as claimed in claim 3, including an electrical device mounted on one of the two major faces of the substrate, said electrical device having terminals, electrical connections being made to the terminals of said device via said conductive rods by way of the other major face of the substrate.

5. An electrical substrate as claimed in claim 1 in which said conductive material is molybdenum arsenide, MoAs.

6. An electrical substrate as claimed in claim 5, including an electrical device mounted on one of the two major faces of the substrate, said electrical device having terminals, electrical connections being made to the terminals of said device via said conductive rods by way of the other major face of the substrate.

7. An electrical substrate as claimed in claim 1 in which said conductive material is chromium arsenide, CrAs.

8. An electrical substrate as claimed in claim 7, including an electrical device mounted on one of the two major faces of the substrate, said electrical device having terminals, electrical connections being made to the terminals of said device via said conductive rods by way of the other major face of the substrate.

9. An electrical substrate having two major faces at least one of which is suitable for the epitaxial deposition of electrical components, said substrate including a plurality of rods of a conductive material embedded in an insulator matrix of silicon, said rods being microscopic in cross section and extending in the same general direction as each other between the two major faces of the substrate.

10. An electrical substrate as claimed in claim 9, including an electrical device mounted on one of the two major faces of the substrate, said electrical device having terminals, electrical connections being made to the terminals of said device via said conductive rods by way of the other major face of the substrate.

11. An electrical substrate as claimed in claim 9 in which said conductive material is niobium silicide, $NbSi_2$.

12. An electrical substrate as claimed in claim 11, including an electrical device mounted on one of the two major faces of the substrate, said electrical device having terminals, electrical connections being made to the terminals of said device via said conductive rods by way of the other major face of the substrate.

13. An electrical substrate as claimed in claim 9, in which said conductive material is tantalum silicide, $TaSi_2$.

14. An electrical substrate as claimed in claim 13, including an electrical device mounted on one of the two major faces of the substrate, said electrical device having terminals, electrical connections being made to the terminals of said device via said conductive rods by way of the other major face of the substrate.

15. An electrical substrate as claimed in claim 9, in which said conductive material is molybdenum silicide, $MoSi_2$.

16. An electrical substrate as claimed in claim 15, including an electrical device mounted on one of the two major faces of the substrate, said electrical device having terminals, electrical connections being made to the terminals of said device via said conductive rods by way of the other major face of the substrate.

* * * * *